United States Patent
[19]

Hirose

[11] Patent Number: 6,097,097

[45] Date of Patent: *Aug. 1, 2000

[54] SEMICONDUCTOR DEVICE FACE-DOWN BONDED WITH PILLARS

[75] Inventor: Tatsuya Hirose, Kawasaki, Japan

[73] Assignee: Fujitsu Limited, Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/914,769

[22] Filed: Aug. 20, 1997

[30] Foreign Application Priority Data

Aug. 20, 1996 [JP] Japan ................................. 8-218929

[51] Int. Cl.⁷ ........................ H01L 23/495; H01L 23/02; H01L 23/48; H01L 23/28

[52] U.S. Cl. ........................ 257/778; 257/680; 257/659; 257/664; 257/788; 257/737; 257/738; 257/691; 257/698; 174/52.2

[58] Field of Search ..................... 257/94, 668, 691, 257/700, 728, 666, 778, 784, 659, 664, 685, 698, 704, 706, 723, 724, 737, 777, 795, 787–791, 680; 174/52.2; 361/818

[56] References Cited

U.S. PATENT DOCUMENTS

| | | | |
|---|---|---|---|
| 5,194,934 | 3/1993 | Yamazaki et al. | 257/782 |
| 5,371,404 | 12/1994 | Juskey et al. | 257/795 |
| 5,436,497 | 7/1995 | Miyanchi et al. | 257/737 |
| 5,448,114 | 9/1995 | Kondoh et al. | 257/737 |
| 5,629,566 | 5/1997 | Doi et al. | 257/790 |
| 5,641,996 | 6/1997 | Omoya et al. | 257/787 |
| 5,682,066 | 10/1997 | Gamota et al. | 257/795 |
| 5,684,677 | 11/1997 | Uchida et al. | 257/737 |
| 5,773,896 | 6/1998 | Fujimoto et al. | 257/778 |
| 5,801,447 | 9/1998 | Hirano et al. | 257/778 |
| 5,818,113 | 10/1998 | Iseki et al. | 257/778 |
| 5,834,835 | 11/1998 | Maekawa | 257/778 |

FOREIGN PATENT DOCUMENTS

| | | | |
|---|---|---|---|
| 55-62776 | 5/1980 | Japan | 257/788 |
| 56-50546 | 5/1981 | Japan | 257/789 |
| 58-134449 | 8/1983 | Japan | 257/789 |
| 1-152750 | 6/1989 | Japan | 257/790 |
| 1-209750 | 8/1989 | Japan | 257/790 |
| 1-238148 | 9/1989 | Japan . | |
| 2-101753 | 4/1990 | Japan | 257/788 |
| 4-369233 | 12/1992 | Japan . | |
| 6-204293 | 7/1994 | Japan . | |

*Primary Examiner*—Alexander Oscar Williams
*Attorney, Agent, or Firm*—Armstrong, Westerman, Hattori, McLeland & Naughton

[57] ABSTRACT

A face-down-bonded semiconductor device having: a semiconductor substrate having a semiconductor electric/electronic circuit formed on the surface of the semiconductor substrate, the circuit having contact terminals; wiring pillars made of conductive material and disposed on the contact terminals on the surface of the semiconductor substrate; and support pillars disposed at positions different from the contact terminals on the surface of the semiconductor substrate, the support pillars each having a top surface generally at the same height as the height of each of the wiring pillars. The face-down-bonded semiconductor device can provide a sufficient support force and prevent degradation of the electrical characteristics.

14 Claims, 14 Drawing Sheets

SEMICONDUCTOR DEVICE FACE-DOWN BONDED WITH PILLARS

This application is based on Japanese Patent Applications Nos. 8-218929 and 8-218928 both filed on Aug. 20, 1996, the entire contents of which are incorporated herein by reference.

BACKGROUND OF THE INVENTION a) Field of the Invention

The present invention relates to high frequency semiconductor devices, and more particularly to high frequency semiconductor devices with a high frequency semiconductor IC chip which is face-down-bonded to a dielectric circuit board.

b) Description of the Related Art

Monolithic microwave integrated circuits (MMIC) are known as semiconductor IC devices used in a high frequency band such as microwaves and millimeter waves. Although a high frequency band is preferentially used for signal transmission and reception, some signal processing and other operations may be performed in another frequency band not so high in many cases. In such a case, each circuit unit operating at a high frequency band has been formed in an IC chip and bonded to a circuit board. Most of MMIC's are made of such IC chips.

The mobility of electric charge carried in a semiconductor is limited by the material of semiconductor. The carrier mobility in Si which is used most often as the material of semiconductor devices, is generally lower than that in compound semiconductor such as GaAs and InP. Compound semiconductor is therefore more suitable for the material of high frequency IC's than Si. Compound semiconductor is also suitable for high frequency circuits because it can form semiinsulating regions therein. A compound semiconductor substrate can hence form semiconductor devices having very low junction capacitances. Most MMIC's are therefore made of compound semiconductor chips although these chips are very expensive.

Millimeter band circuits are used, for example, in radars operating at 77 GHz. If all circuits of a radar are formed on a compound semiconductor substrate, the radar becomes very expensive because the area occupied by a transmitter antenna becomes large. In order to realize a radar of low cost and high performance, it is desired that an antenna is formed on a low cost substrate to which an MMIC made of compound semiconductor is electrically connected.

Electrical connection of an MMIC to a dielectric substrate formed with transmission lines, however, poses some problems. The simplest way to the electrical connection is to bond the bottom surface of an MMIC to a dielectric substrate and connect terminals on the top surface of the MMIC to the transmission lines formed on the dielectric substrate by some interconnection means such as wires and tapes. However, if this interconnection means has inductance, a flow of high frequency current is hindered. It is therefore undesirable to use a narrow and long interconnection means.

A more preferred way is to face-down-bond an MMIC, with its circuit surface turned upside down, to a dielectric substrate formed with transmission lines. With this method, interconnection means can be shortened and inductance thereof can be reduced. Electrical connection to a circuit can be realized by forming bumps, pillars, metal plates, or the like, between MMIC and lines on the dielectric substrate.

Stray or parasitic capacitance formed on a circuit operating at a high frequency poses significant issues. Capacitance formed between a line and a nearby conductor allows a high frequency leak current to flow therebetween. It is therefore desired that a separation area is made of material having as small a dielectric constant as possible. Media having a lowest dielectric constant are gas, such as air, and vacuum. In this connection, face-down-bonding of MMIC provides an ample possibility of achieving high performance.

A sufficiently strong support force is, however, difficult to obtain if an MMIC is supported only by bumps, pillars or metal plates. Vibrations or even light impacts may dismount the MMIC from a dielectric substrate.

In order to solve the above problems, a method has been proposed in which reinforcing resin is filled in between an MMIC and a dielectric substrate. For example, light setting type resin is filled in and cured with light transmitted through a dielectric substrate. With this structure, an MMIC can be held with a sufficient support force.

Although the support force is ensured by filling in reinforcing resin between a face-down-bonded MMIC and an MMIC mounting dielectric substrate, the electrical characteristics of the MMIC are degraded.

SUMMARY OF THE INVENTION

It is an object of the present invention to provide a face-down-bonded semiconductor device capable of giving a sufficient support force and preventing degradation of the electrical characteristics.

It is another object of the present invention to provide a method of manufacturing a face-down-bonded semiconductor device capable of giving a sufficient support force and preventing degradation of the electrical characteristics.

According to one aspect of the present invention, there is provided a face-down-bonded semiconductor device comprising: a semiconductor substrate having a semiconductor electric/electronic circuit formed on the surface of the semiconductor substrate, the circuit having contact terminals; wiring pillars made of conductive material and disposed on the contact terminals on the surface of the semiconductor substrate; and support pillars disposed at positions different from the contact terminals on the surface of the semiconductor substrate, the support pillars each having a top surface generally at the same height as the height of each of the wiring pillars.

Use of both the wiring pillars and support pillars increases the support strength of the face-down-bonded semiconductor device. With a proper pillar layout, the reinforcing material member can be held back at the positions of the pillars by the dam action of the pillars.

According to another aspect of the present invention, there is provided a face-down-bonded semiconductor device comprising: a first substrate having an insulating surface on which wiring lines are formed; a second substrate having a semiconductor surface and formed with a semiconductor electric/electronic circuit having contact terminals on the surface facing the wiring lines: a plurality of pillars for defining a space between the first and second substrates, the plurality of pillars including wiring pillars for connecting the wiring lines to the contact terminals and support pillars for connecting the first and second substrates; and a reinforcing material member covering the surface of the second substrate on the opposite side to the semiconductor surface, sealing the space and reaching the first substrate.

According to a further aspect of the present Invention, there is provided a method of manufacturing a face-downbonded semiconductor device comprising: a preparing step of preparing a first substrate having an insulating surface on which wiring lines are formed and a second substrate having a semiconductor surface and formed with a semiconductor electric/electronic circuit having contact terminals on the semiconductor surface; a face-down-bonding step of disposing the first and second substrates with the insulating film being faced with the semiconductor surface, connecting the wiring lines to the contact terminals by wiring pillars, and connecting the insulating surface to the semiconductor surface by support pillars; and a sealing step of sealing with reinforcing material an opening formed at a periphery of a space defined by the first and second substrate facing each other, the semiconductor electric/electronic circuit being located in the space.

As above, it is possible to stiffly face-down-bond a high frequency semiconductor IC chip to a support substrate.

Even if reinforcing material of resin or the like is used, the electrical characteristics of a high frequency semiconductor device can be prevented from being degraded.

BRIEF DESCRIPTION OF THE DRAWINGS

FIG. 1A' is a view similar to FIG. 1A showing another embodiment of the invention.

DETAILED DESCRIPTION OF THE PREFERRED EMBODIMENTS

Embodiments of the invention will be described with reference to the accompanying drawings.

Figure 1A:
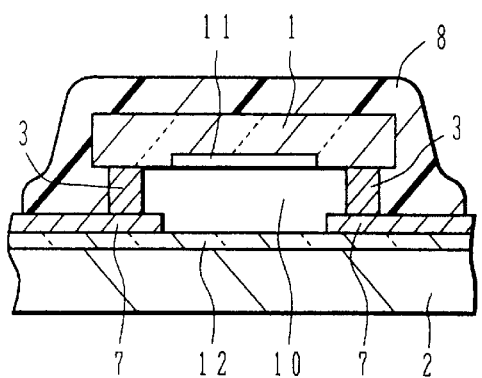
FIGS. 1A to 1D are vertical cross sectional views, a plan view, and a schematic lateral cross sectional view showing comparison between a face-down-bonded semiconductor device according to an embodiment of the invention and a conventional face-down-bonded semiconductor device.

FIG. 1A shows a face-down-bonded semiconductor device according to an embodiment of the invention. An MMIC 1 formed on a compound semiconductor substrate is face-down-bonded by pillars 3 to the surface of a dielectric substrate 2 made of ceramic, glass or semiconductor. If the dielectric substrate 2 is made of semiconductor, it is desired to cover the surface thereof with an insulating layer 12.

Figure 1D:
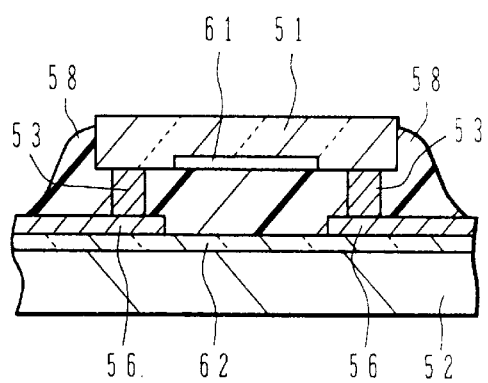
Figure 1B:
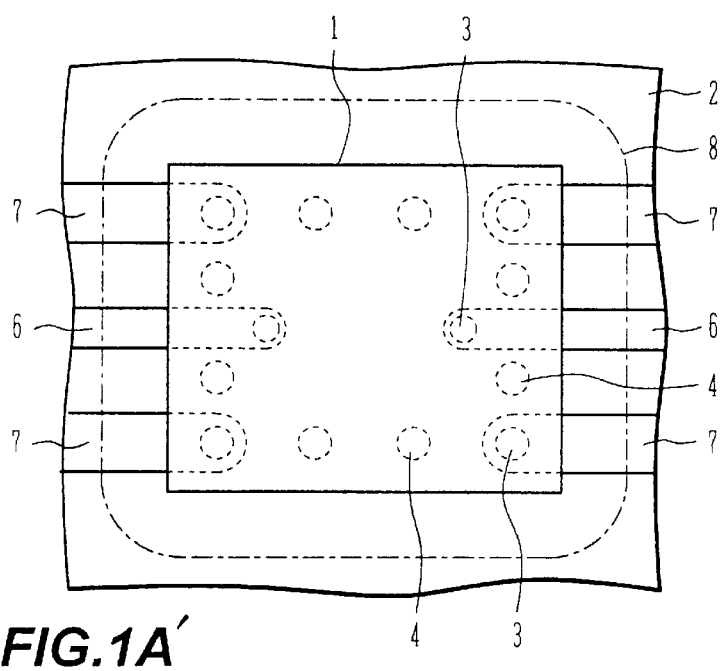
Figure 1A:
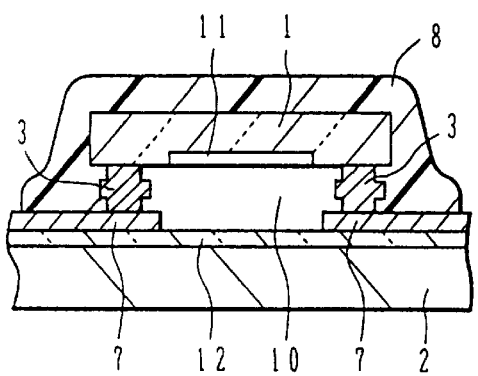

As shown in FIG. 1B, signal lines 6, power lines 7 and the like are formed on the surface of the dielectric substrate 2 and connected to wiring pillars 3. A plurality of support pillars 4 are also formed at positions different from contact terminals for MMIC 1. These support pillars 4 together with the wiring pillars 3 connect MMIC 1 to the dielectric substrate 2.

Reinforcing material 8 is coated, covering the upper surface (opposite side to the surface on which electric/electronic circuit components are formed) of MMIC 1. The reinforcing material 8 surrounds the space 10 between the dielectric substrate 2 and MMIC 1, and covers the surface of the dielectric substrate 2, surrounding the space 10 to thereby hermetically seal the latter.

As shown in FIG. 1B, the wiring pillars 3 and support pillars 4 are disposed at a predetermined pitch, surrounding the central area of MMIC 1, and operate to hold back or stop resin of the reinforcing material 8 as the resin tends to move toward the inside.

Figure 1C:
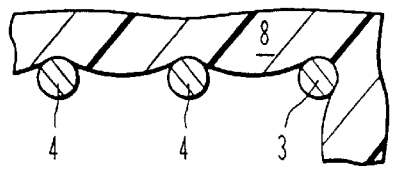

As shown in FIG. 1C, the reinforcing material 8 forms a predetermined contact angle relative to the pillars 3 and 4 and is held back taking the inwardly swelling shape. The interval of the pillars 3 and 4 and the viscosity of the reinforcing material 8 are selected such that the reinforcing material 8 does not flow inward between the pillars 3 and 4 but is held back by these pillars. It is also effective to give some surface treatment of the pillars 3 and 4 in order to control the contact angle (i.e. repelling surface tension) between the pillars 3 and 4 and the reinforcing material 8.

Figure 7A:
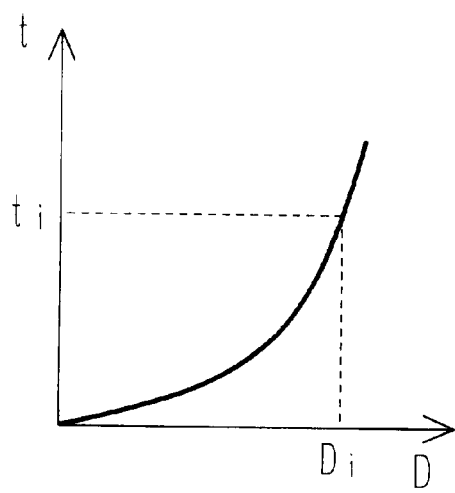
FIGS. 7A to 7C are graphs and a plan view illustrating how the characteristics of a combination of pillar and reinforcing material are measured.
Figure 7B:
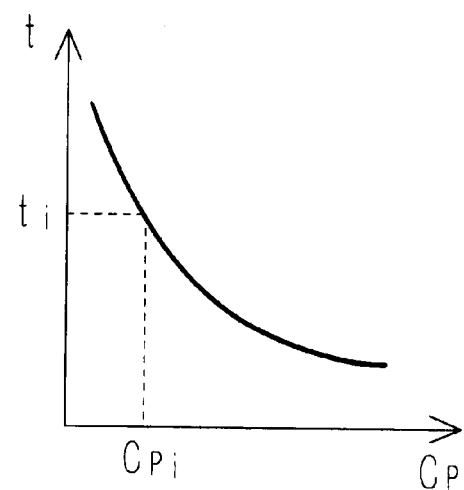
Figure 7C:
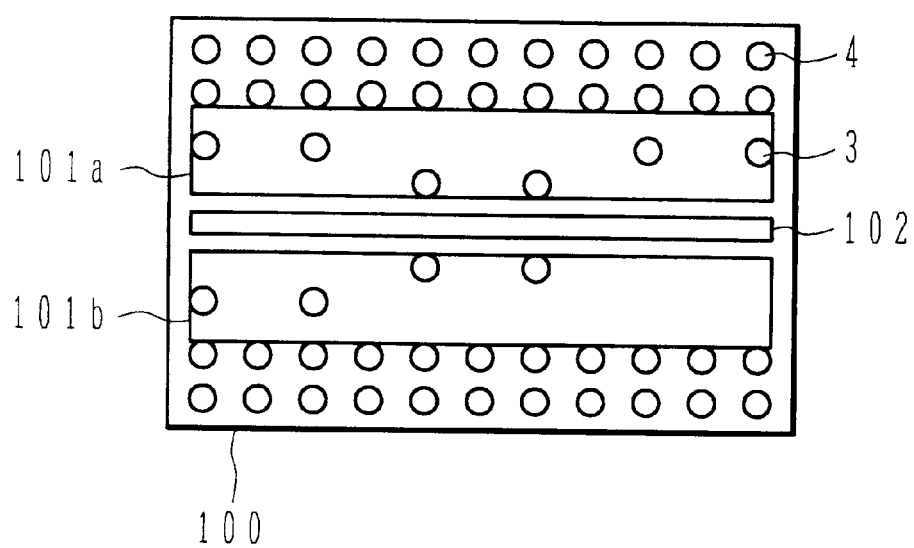

It is desired to examine how each combination of the layout of pillars and the kind of reinforcing material gives particular hold-back effects. FIGS. 7A to 7C show measurement results of an advance or penetration length of reinforcing material in each test element.

FIG. 7C shows an example of the structure of a test element. A signal line 102 extends laterally on the surface of a dielectric substrate 100. Broad ground conductors 101a and 101b are disposed at upper and lower positions of the signal line 102. Support pillars 4 of two rows are disposed in each outer area of the ground conductors 101a and 101b. A plurality of wiring pillars 3 are also formed on the ground conductors 101a and 101b. Another dielectric substrate was placed upon this test element of the dielectric substrate 100 shown in FIG. 1C, and reinforcing material of polyimide or the like was coated over the peripheral side of a lamination of the two dielectric substrates.

With the dielectric substrate 100 shown in FIG. 7C and the other substrate stacked thereupon, measurements were conducted as to how the reinforcing material advancing from the peripheral side of the two substrates is restrained by the support pillars 4.

Namely, the other dielectric substrate was placed on the dielectric substrate 100, and reinforcing material was coated to measure an advance or penetration length of the material moved inward between the support pillars 4. The distance (gap) between support pillars 4 is represented by D, and the advance length of reinforcing material is represented by t. The viscosity of reinforcing material is represented by Cp in Pa·sec.

FIGS. 7A and 7B are graphs showing briefly the characteristics obtained through such measurements. In FIG. 7A, the abscissa represents the distance between support pillars 4 and the ordinate represents the advance length t. In FIG. 7B, the abscissa represents the viscosity Cp of reinforcing material and the ordinate represents the advance length t. The advance length t can be approximated by:

$$t \approx A \cdot exp(-a3 \cdot Cp) \cdot [exp(a1 \cdot h) - 1] \cdot exp(a2 \cdot D) - 1]$$

where h represents the height of each pillar, a1, a2, a3 and A are constants. Cp, H and D are positive numbers. Measurements were conducted a plurality of times by changing the pillar distance D and the reinforcing material viscosity Cp to obtain the characteristics shown in FIGS. 7A and 7B. The above formula of the advance length t was applied to these characteristics to obtain the constants a1, a2, a3 and A. If these constants are given, the advance length t for a desired pillar interval D and reinforcing material viscosity Cp can be calculated from the above formula. For example, assuming that the constants are $A=2.16 \times 10^{-6}$, $a1=10^6$, $a2=6.15 \times 10^4$ and $a3=1.0$, if a pillar height $h=20 \mu m$, a pillar diameter $\phi=40 \mu m$ and a pillar interval $D=150 \mu m$, then the viscosity of reinforcing material Cp is about 27 Pa·sec.

It is preferable to set the pillar diameter to 5 $\mu m$ or larger and the pillar height to 5 $\mu m$ or higher. The pillar material is, for example, alloy of Au and Sn.

In the layout shown in FIG. 1B, the pillar 3 connected to the power line 7 is in contact with the reinforcing material 8. However, since high frequency current does not flow through the power line, the circuit operation is not so much affected even if the pillars 3 are in contact with the reinforcing material 8 of a high dielectric constant. The pillars 3 via which high frequency signals are transferred are disposed in the inner area of MMIC 1 so that they are not in contact with the reinforcing material 8.

As shown in FIG. 1A, an electric/electronic circuit 11 of MMIC 1 faces the space 10 sealed with the upper and lower substrates 1 and 2 and the reinforcing material 8, and does not contact the reinforcing material 8.

With this configuration, the wiring pillars 3 as well as the support pillars 4 can increase the support force of MMIC, and also prevent the reinforcing material 8 made of resin or the like surrounding MMIC from advancing to the lower area of the space 10 under MMIC 1. The reinforcing material 8 in addition to the pillars 3 and 4 stiffly fixes MMIC 1 to the dielectric substrate 2. MMIC 1 can therefore be prevented from being dismounted from the dielectric substrate 2 even under vibrations and impacts. Furthermore, since the surface of the electric/electronic circuit of MMIC 1 is exposed to the sealed space 10, the circuit characteristics of MMIC 1 can be prevented from being degraded.

For comparison, an example of a conventional MMIC face-down-bonded to a substrate is shown in FIG. 1D. An MMIC 51 is face-down-bonded via pillars 53 to a dielectric substrate 52. The surface of the dielectric substrate 52 is covered with an insulating layer 62 on which surface a wiring line 56 is formed.

The space between MMIC 51 and the dielectric substrate 52 is filled with reinforcing material 58. This reinforcing material 58 not only fills the space under MMIC 51 but also covers the peripheral side of MMIC 51, so that MMIC 51 can be stiffly fixed to the dielectric substrate 52.

According to the studies made by the inventor, the reinforcing material 58 of resin or the like in contact with the surface of ah electric/electronic circuit 61 of MMIC 51 applies stress to MMIC 51, lowering the circuit characteristics thereof. As compared to air or vacuum, the dielectric constant of the reinforcing material 58 is high. This higher dielectric constant may possibly degrade the circuit characteristics more.

With the configuration shown in FIG. 1A, it is possible to prevent stress application to the electric/electronic circuit 11 of MMIC 1, and to isolate the lower surface of the electric/electronic circuit 11 by medium of air or vacuum.

Figure 2:
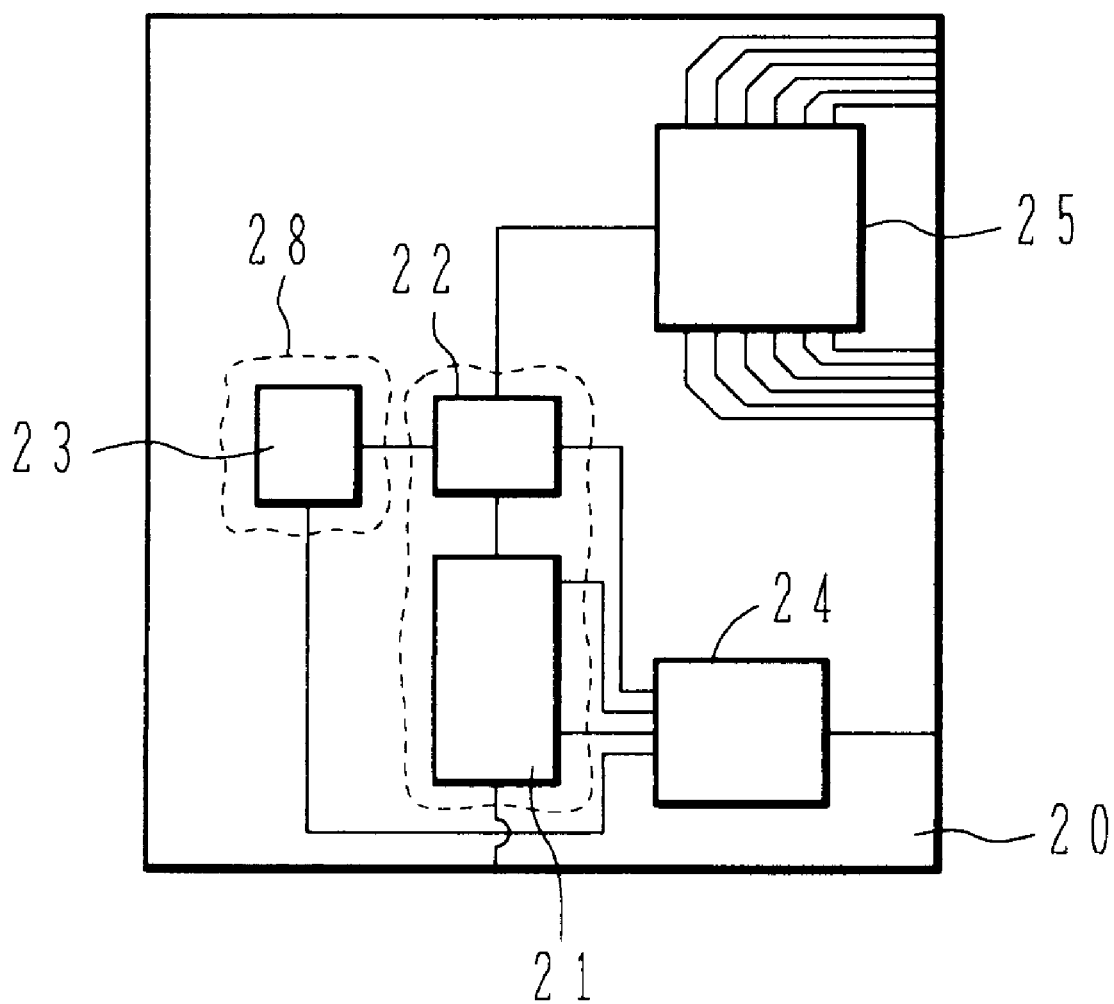
FIG. 2 is a schematic plan view of a multi-chip module according to an embodiment of the invention.

FIG. 2 shows an example of the structure of a multi-chip module using MMIC shown in FIG. 1A. This multi-chip module forms a millimeter wave radar.

A high frequency amplifier 21, a down-converter 22 and a local oscillator 23 all made of MMIC and formed on compound semiconductor substrates are face-down-bonded to the surface of a dielectric substrate 20 made of Si. These MMIC's are sealed with reinforcing material 28 of epoxy resin or the like. A space is left under each MMIC, hermetically sealed by the reinforcing material 28.

A power supply circuit 24 and a signal processing circuit 25 made by silicon processes are formed in the surface of the Si dielectric substrate 20. The power supply circuit 24 and signal processing circuit 25 are connected to the high frequency amplifier 21, down-converter 22 and local oscillator 23 by wiring lines formed on the surface of the dielectric substrate 20.

The dielectric substrate 20 may also be made of glass, ceramic or the like to mount thereon Si chips of the power supply circuit 24 and signal processing unit 25. These IC chips made of silicon processes may be bonded to the dielectric substrate 20 with their circuit side surfaces directed upward, instead of incorporating face-down-bonding.

Of the circuit units of this multi-chip module, the high frequency amplifier 21, down-converter 22 and local oscillator 23 operate at high frequencies, whereas the operation frequencies of the power supply circuit 24 and signal processing unit 25 are much lower than those of MMIC. Therefore, the power supply circuit 24 and signal processing unit 25 are not so much necessary to consider any countermeasure against high frequency signal transmission.

In the above description, MMIC made of compound semiconductor is used illustratively. Semiconductor devices to be face-down-bonded are not limited only to compound semiconductor MMIC. For example, an Si IC chip operating at high frequencies may be used. If Si is used, it is difficult to form a semi insulating substrate. If an Si IC chip is cut in each small circuit unit, it becomes possible to electrically separate small-sized circuit units formed in separate substrates. If such Si chips are face-down-bonded, it becomes possible, for example, to reduce current flowing through the substrate.

Figure 3A:
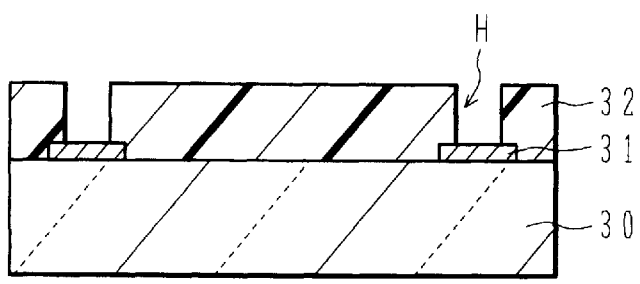
FIGS. 3A to 3E are cross sectional views illustrating the processes of forming pillars on substrates.
Figure 3B:
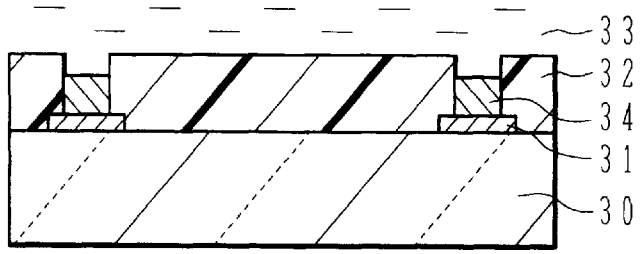
Figure 3C:
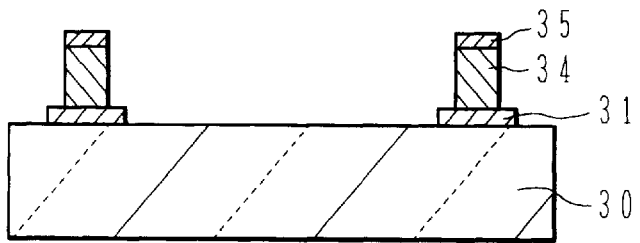

FIGS. 3A to 3C are cross sectional views illustrating a pillar forming method. A substrate 30 may be a substrate of MMIC or a dielectric substrate. The substrate 30 made of glass, ceramic, semiconductor or the like has an insulating surface on which metal pads 31 are formed by vapor deposition, sputtering, plating or the like, the metal pad 31 being used for the base of a pillar. A photoresist layer 32 is coated on the surface of the substrate, exposed and developed to form holes or openings H for forming a pillar.

As shown in FIG. 3B, the substrate 30 with a photoresist mask 32 is dipped in plating liquid 33 to perform electroplating or electroless plating. A plated main layer 34 grows therefore on the metal pattern exposed in the opening of the photoresist mask 32.

After the plated main layer 34 is formed, a pad layer 35 suitable for alloying or the like is formed, if necessary, as shown in FIG. 3C. This pad layer 35 may be formed by plating continuously after the plating process described above or by other methods such as sputtering. Thereafter, the photoresist mask 32 is removed.

If the substrate is made of compound semiconductor such as GaAs, the pad layers 31 and 35 may be formed by Ge. The plated main layer 34 which is preferably good electric conductor is made of, for example, Au.

Figure 3D:
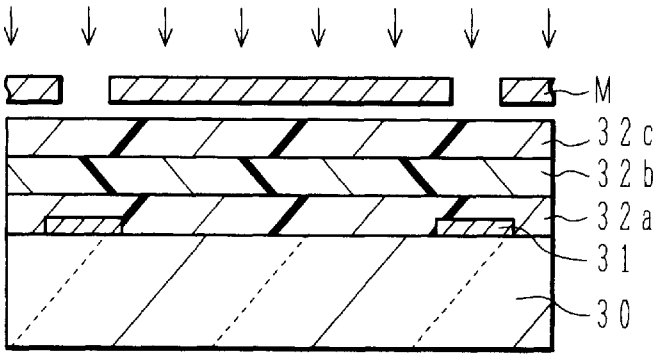
Figure 3E:
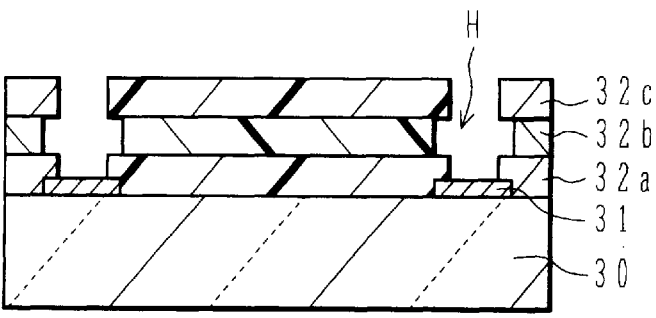

FIGS. 3D and 3E illustrate an example of a method of controlling the cross section of a plated layer.

As shown in FIG. 3D, three photoresist layers 32a, 32b and 32c are coated on a substrate 30 formed with pads 31. For example, the middle photoresist layer 32b is selected so as to provide a higher photosensitivity than those of the upper and lower photoresist layers 32a and 32c. By using a mask M, the photoresist layers are exposed so as to form holes or openings over the pads 31.

As shown in FIG. 3E, since the middle photoresist layer 32b has a higher photosensitivity than those of the upper and lower photoresist layers 32a and 32c, an opening H has a larger diameter at the area of the middle photoresist layer 32b than at the other areas. By using this resist mask, a plating process is performed so that a pillar, such as is shown at 3' in the FIG. 1A embodiment of the invention, can be formed which has a swelled middle area in its height direction. A plurality of resist layers may be used to form a pillar having a different cross section by adjusting the properties of these photoresist layers.

FIGS. 4A to 4D show examples of the layout of pillars on a substrate. As used herein, the word, "loops", means an array of pillars 3 and 4 upstanding between the substrate 30 and the MMIC 1 and arranged in one or more lines L1 and/or L2 adjacent the peripheral edges of the substrate 30 and defining a space 10 surrounded by said line or lines.

Figure 4A:
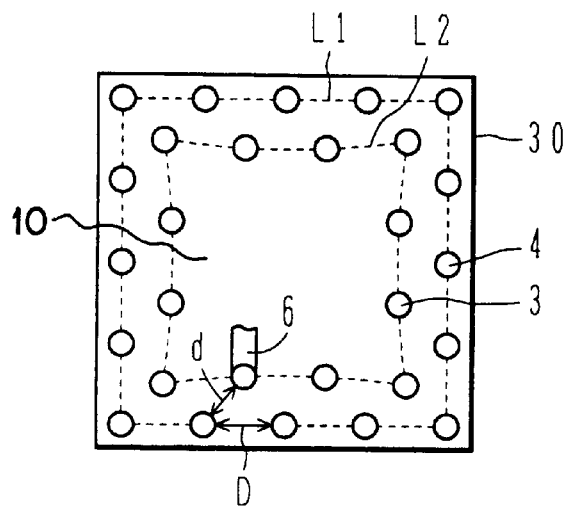
FIGS. 4A to 4E are plan views showing layouts of pillars and a schematic cross sectional view illustrating surface treatment of a pillar.

In FIG. 4A, there are two loops L1 and L2 formed in the outer peripheral area of a substrate 30. Pillars 3 and 4 are disposed along these loops. Along the outer loop L1, support pillars 4 are disposed at a constant pitch. This pitch of pillars 4 is preferably selected so that reinforcing material for MMIC fixation does not advance inward or penetrate through between the pillars 4 into the space 10.

For example, if polyimide having a viscosity Cp of 900 Pa·sec is used as the reinforcing material, the pitch of the pillars is set to 300 μm. This combination of the reinforcing material viscosity and pillar pitch allows the pillars to perfectly hold back the reinforcing material thereby restrain it from entering the space 10. The combination of viscosity and pitch is not limited to this example.

For example, the viscosity Cp of the reinforcing material may be about 20 Pa·sec. The pillar pitch is preferably adjusted in accordance with the reinforcing material viscosity. Along the inner loop L2, pillars 3 for the connection to signal lines and power lines are disposed. In order not to make the pillars 3 contact the reinforcing material, it is desired to properly set the distance D between pillar 4 disposed along the outer loop L1 and the distance d between the inner and outer pillars 3 and 4.

Figure 4B:
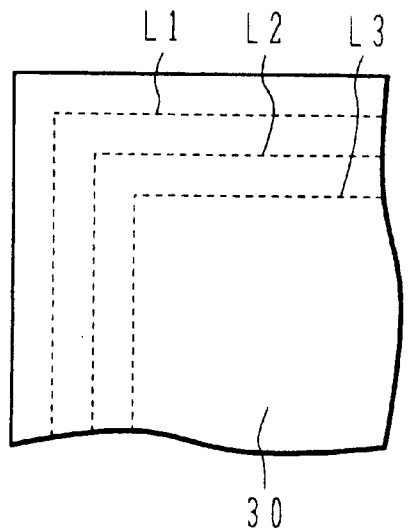

In order to more reliably prevent the contact between signal line pillars and reinforcing material, pillars may be disposed as shown in FIG. 4B along three loops L1, L2 and L3. In this case, along the two outer loops L1 and L2, support pillars are disposed, and along the innermost loop L3, pillars for signal lines and power lines are disposed. Pillars for power lines may also be disposed along the outer loop.

The signal line pillars can also be intentionally made in contact with the reinforcing material so that the impedance of a signal line can be controlled.

Figure 4C:
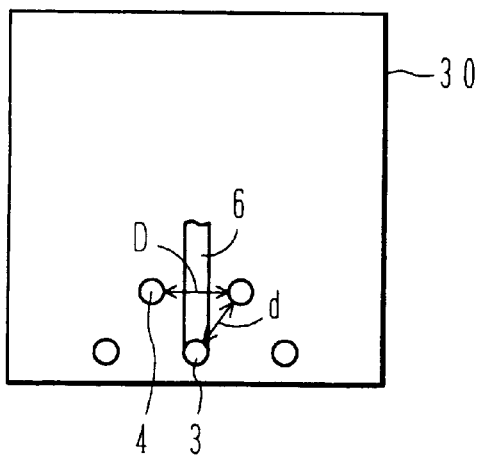

FIG. 4C shows the pillar layout for the impedance control. A signal line 6 is connected to a pillar 3 disposed along an outer loop. In this case, reinforcing material contacts the outer wall of the pillar 3 so that the impedance of the pillar 3 is controlled in accordance with the dielectric constant of the reinforcing material. The more detailed embodiment for this will be later described.

Pillars may be disposed in other shapes different from the loop shape described above.

Figure 4D:
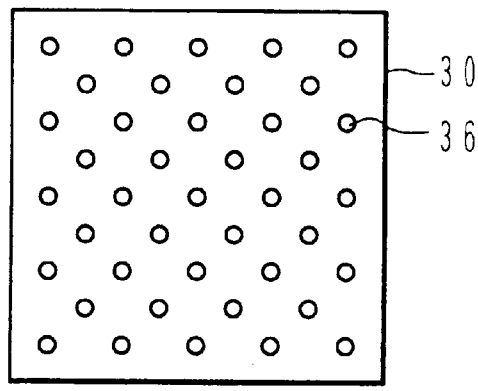

FIG. 4D shows another layout of pillars. Pillars 36 are disposed over the whole area of a substrate 30, preferably in a staggered lattice shape. Of such a number of pillars, desired pillars may be used for signal and power lines.

All pillars may be plated at a time, or may be formed by other methods. For example, prefabricated pillars may be mounted upright on a substrate. In this case, the material of pillars is not limited only to metal, but other materials such as semiconductor and dielectric material may be used.

The ability of pillars to restrain advance of reinforcing material also depends on a contact angle between pillars and reinforcing material.

Figure 4E:
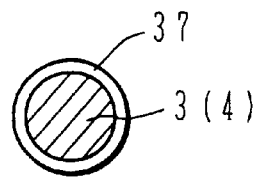

FIG. 4E shows the structure of a metallic pillar 3, 4 coated with a dielectric film 37 such as SiN. As compared to metal, this dielectric film has low wettability relative to reinforcing material such as polyimide and epoxy, and presents a higher ability to prevent advance of reinforcing material. A metallic pillar or a pillar formed with a dielectric film may be processed by SFe plasma or the like to fluoridize the surface thereof. The fluoridized surface is hard to become wet relative to reinforcing material such as polyimide.

It is preferable to stiffly fix pillars to a substrate as much as possible. One approach to increasing the fixation between pillars and a substrate is alloying.

Figure 5A:
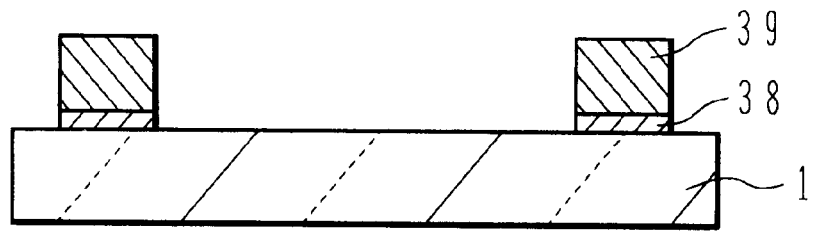
FIGS. 5A to 5C are cross sectional views illustrating alloying processes.
Figure 5B:
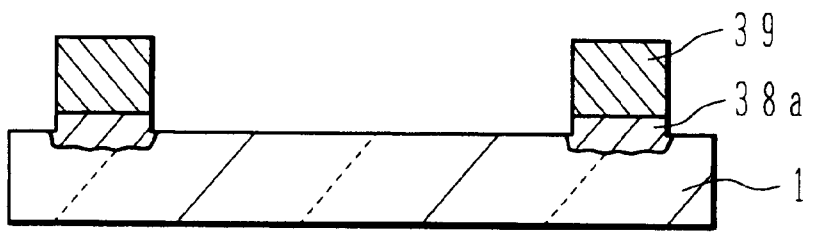
Figure 5C:
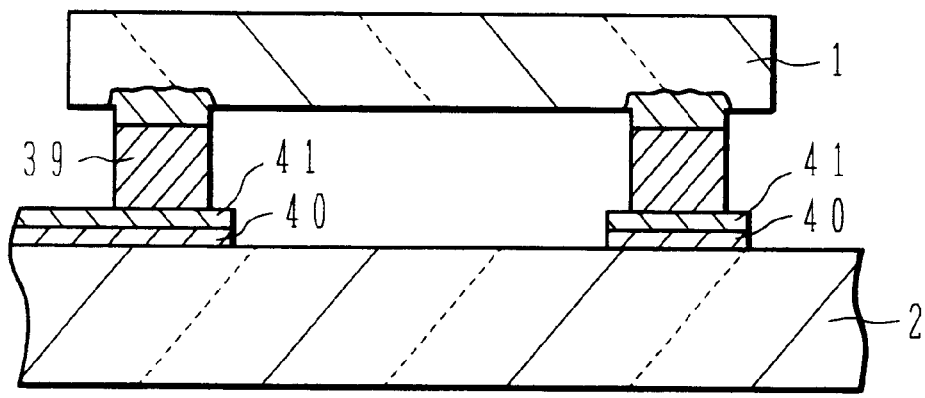

FIGS. 5A to 5C illustrate a method of forming an alloy layer on the surface of a substrate.

As shown in FIG. 5A, an Au pillar 39 on a Ge layer 38 is formed over the surface of a substrate 1 made of semi insulating GaAs. The Ge layer 38 may be formed by sputtering, and the Au pillar 39 may be formed by plating.

As shown in FIG. 5B, the substrate 1 is heated to alloy GaAs and Ge to form an alloy layer 38a. This alloy layer is stiffly coupled to the GaAs substrate 1.

If the pillar 39 is a wiring pillar, a Ge layer may be formed under the wiring layer in direct contact with the GaAs surface. If a semi insulating GaAs substrate is used, the electrical characteristics are scarcely degraded even if an alloy layer formed under the wiring layer is in direct contact with the substrate. If the pillar 39 is a support pillar, the alloy layer coupling with the substrate scarcely affects the electrical characteristics.

As shown in FIG. 5C, the GaAs substrate 1 formed with the pillar 39 is face-down-bonded to the surface of a dielectric substrate 2. The dielectric substrate 2 has a wiring layer 40 formed on the surface thereof. A metal layer 41 likely to be alloyed with the pillar 39 may be formed on the surface of the wiring layer 40. With this structure, the metal layer 41 and pillar 39 are alloyed after the face-down-bonding. Thus, a coupling force between the pillar 39 and dielectric substrate 2 can be increased.

Figure 6A:
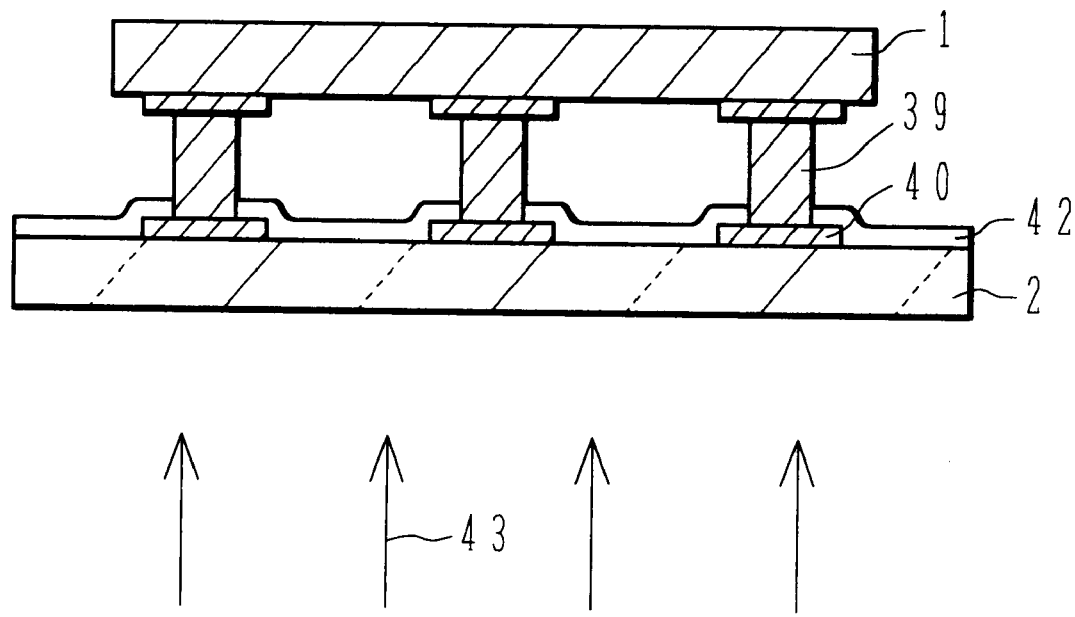
FIGS. 6A and 6B are cross sectional views illustrating an alloying process and a process of increasing a coupling force by pressurized bonding.

As shown in FIG. 6A, if a dielectric substrate 2 is made of transparent material such as quartz and glass and a wiring layer 40 is formed on the dielectric substrate 2, alloying can be performed by laser exposure. The material of the wiring layer 40 is selected so that it can be alloyed with the material of the pillar 39. After the pillar 39 is bonded once to the wiring layer 40, the surface of the dielectric substrate 2 is covered with a dielectric film 42 having a large attenuation coefficient or a high refractive index with respect to laser beams to be used. For example, a resist film or an SiN film may be used for this purpose.

A laser beam 43 is applied to the bottom of the dielectric substrate 2, the wavelength of the laser beam 43 being selected so as to make the laser beam transmit through the substrate 2. The laser beam 43 is absorbed by the dielectric film 42 and wiring layer 40 so that the wiring layer 40 is heated and alloyed with the pillar 39.

Figure 6B:
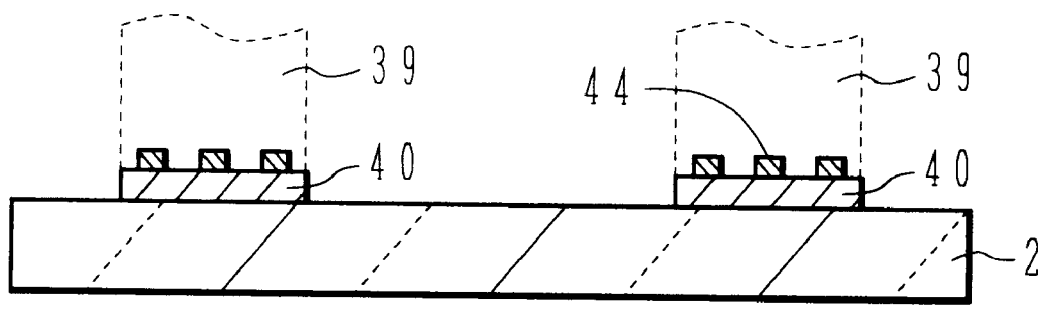

FIG. 6B shows another example of the structure which increases a coupling force between pillars and a substrate. A wiring layer 40 is formed on the surface of a dielectric substrate 2, and a metal pattern 44 of a meshed shape is formed on the surface of the wiring layer 40. A pillar 39 is pushed against the surface of the meshed metal pattern 44, and a pressure is applied further so that the meshed metal pattern 44 eats into the pillar 39 to fix the pillar to the metal pattern. The shape of a pattern formed on the wiring layer 40 is not limited only to a meshed pattern.

Figure 8A:
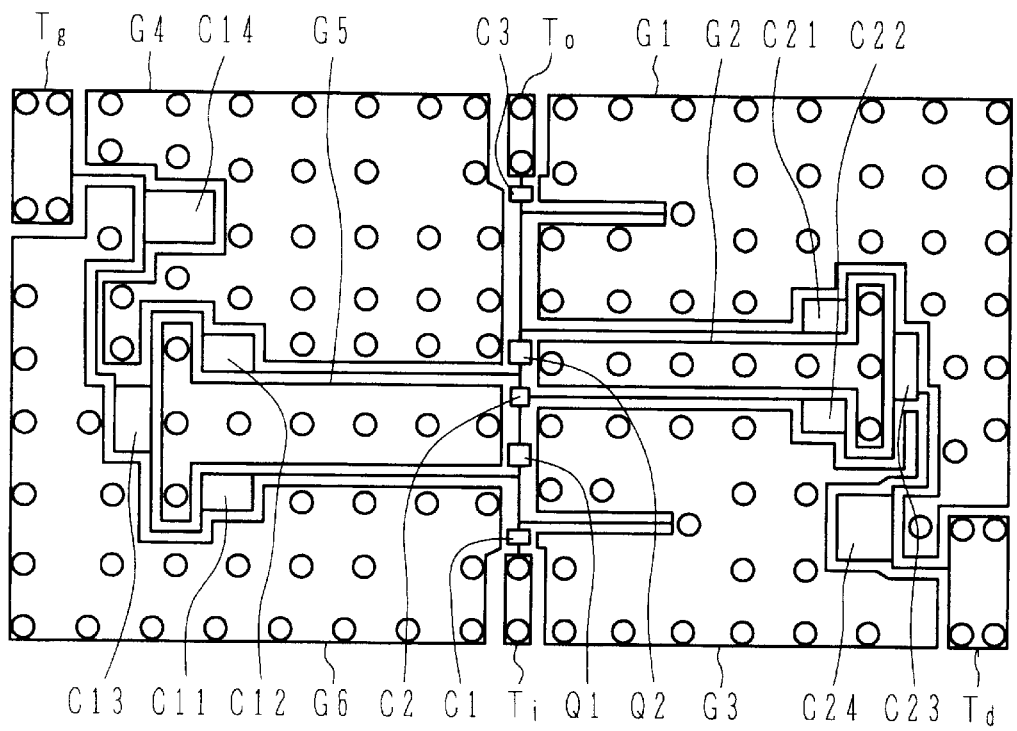
FIGS. 8A and 8B are a schematic plan view showing an example of the structure of a high frequency amplifier and its equivalent circuit diagram.
Figure 8B:
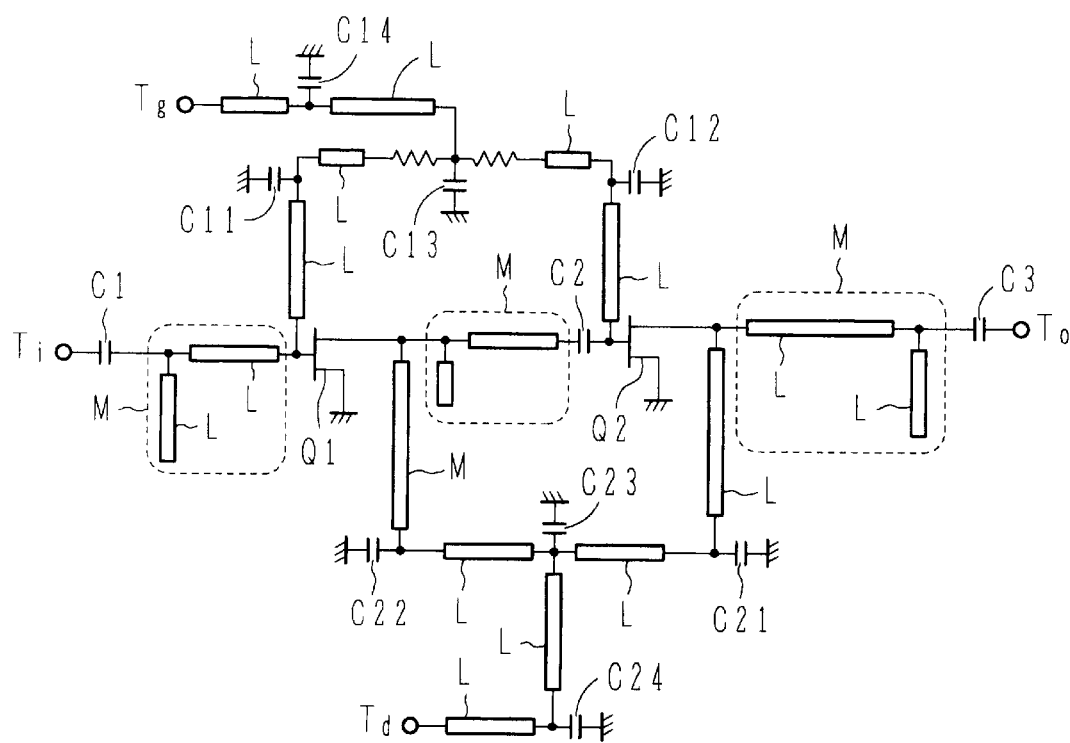

FIGS. 8A and 8B show an example of the structure of an MMIC constituting a high frequency amplifier. FIG. 8A is a schematic plan view of a semiconductor substrate, and FIG. 8B is an equivalent circuit diagram.

In FIG. 8A, an input terminal Ti is formed at the lower middle of the substrate, and an output terminal To is formed at the upper middle thereof. A drain voltage supply terminal Td is disposed at the lower right corner, and a gate voltage supply terminal Tg is disposed at the upper left corner.

Serially connected along a line extending between the input terminal Ti and output terminal To are a capacitor C1 for cutting off DC components, a transistor Q1, a capacitor C2 for cutting off DC components, a transistor Q2 and a capacitor C3 for cutting off DC components. As shown in FIG. 8B, along a line extending between the capacitor C1 and transistor Q1, a matching circuit M is formed which is constituted of two impedance elements. A wiring line is formed for supplying a gate voltage from the gate voltage supply terminal Tg to the gate terminal of the transistor Q1. Along this wiring line, capacitors C11, C13 and C14 are disposed. A length of the line from the gate of the transistor Q1 to the capacitor C11 is ¼ the wavelength of a frequency to be cut. Similarly, lengths of the line to the capacitors C13 and C14 are ¾ and ⅝ the wavelength.

A line is also formed for supplying a voltage from the gate voltage supply terminal Tg to the gate of the other transistor Q2. A capacitor C12 is disposed at a distance of $\lambda/4$ from the transistor Q2, and another capacitor C13 is connected to this line at a distance of $3\lambda/4$ from the transistor Q2. These lengths may also be other values among the odd multiples of $\lambda/4$.

Matching circuits M are also connected between the transistors Q1 and Q2, and between the transistor Q2 and capacitor C3. With these matching circuits, transmission line impedance is matched between the input and output terminal Ti and To.

A line structure, similar to the line structure for supplying the gate voltage from the gate voltage supply terminal Tg, is also provided between the drain voltage supply terminal Td and the transistors Q1 and Q2. Specifically, the line between the transistors Q1 and Q2 is connected to capacitors C22 and C21 to cut off predetermined frequency components, and further connected to the drain voltage supply terminal Td with capacitors C23 and C24 being interposed therebetween.

Broad ground conductors G1 to G6 are formed in an area other than those areas occupied by the above circuit elements. These ground conductors are preferably electrically interconnected via a plurality of air bridges. Almost the whole surfaces of the ground conductors G1 to G6 are formed with pillars. A plurality of pillars are also formed in each area of the input terminal Ti, output terminal To, gate voltage supply terminal Tg and drain voltage supply terminal Td.

Via pillars in the areas of these terminals, signals and powers are supplied. Via a number of pillars on the ground conductors G1 to G6, these conductors G1 to G6 are connected with low resistance to a low resistance ground conductor on a dielectric substrate on which this MMIC substrate is to be face-down-bonded. In this connection, pillars are preferably disposed near each line as many as possible. With this structure, for example, the high frequency amplifier 44 shown in FIG. 2 can be fabricated.

The characteristic impedance of a transmission line changes with a dielectric constant of media surrounding the line and with other parameters. For example, the characteristic impedance of coplanar lines in contact with air formed on a ceramic substrate is different from the characteristic impedance when the lines are covered with resin. If part of the lines is covered with resin, the design of the lines is desired to be changed in order to make characteristic impedances have the same value.

Figure 9A:
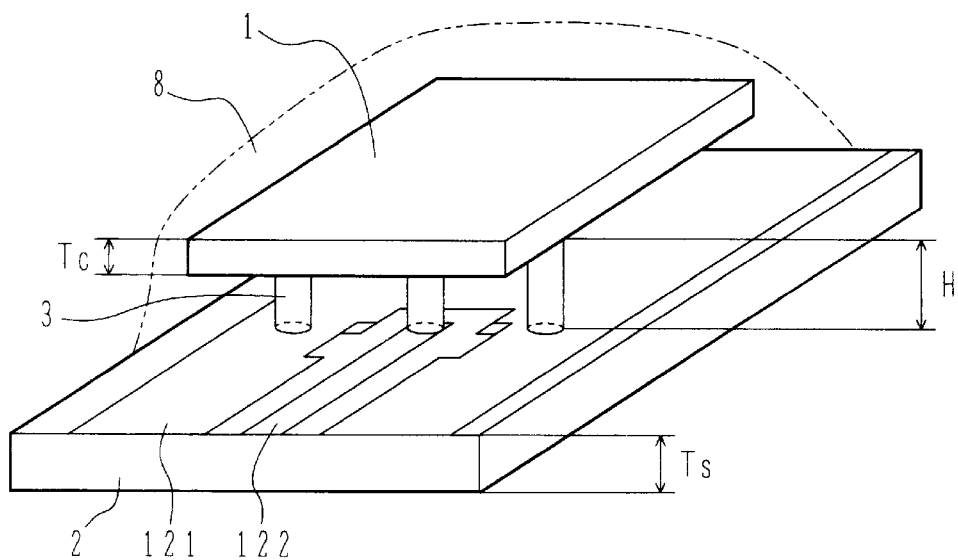
FIGS. 9A and 9B are a perspective view and a plan view of a face-down-bonded semiconductor device having a line impedance matching structure according to another embodiment of the invention.
Figure 9B:
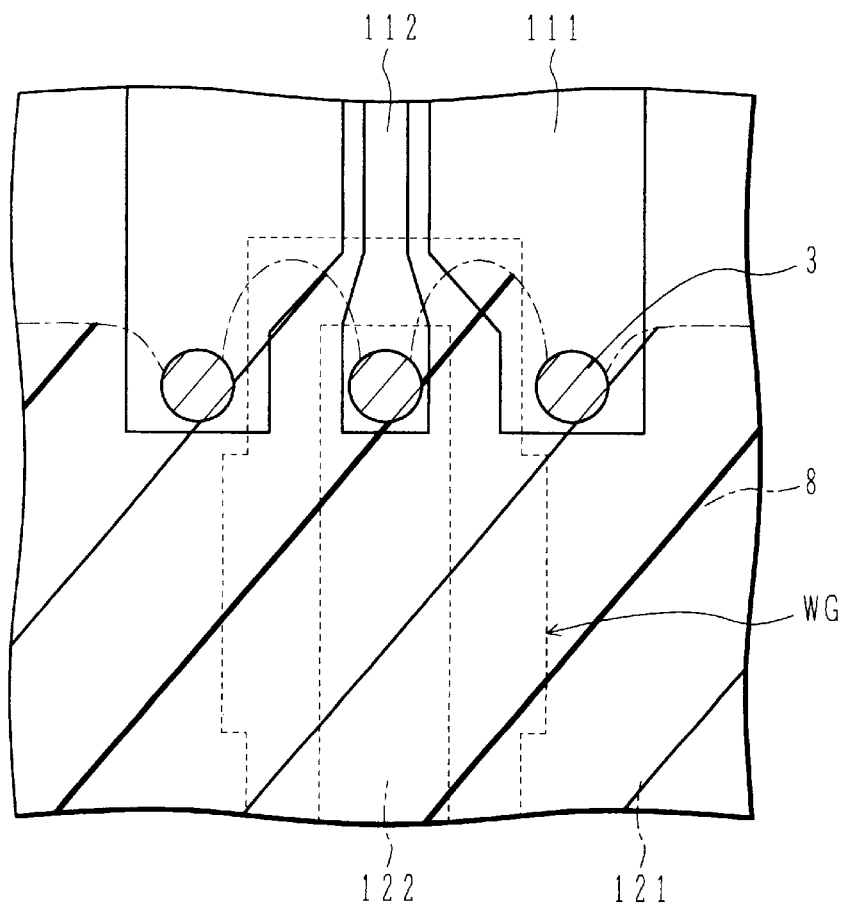

FIGS. 9A and 9B show the structure of a face-down-bonded semiconductor device according to another embodiment of the invention. FIG. 9A is a perspective view of the device, and FIG. 9B is a partial plan view broken in part.

Coplanar wiring lines 121 and 122 are formed on the surface of a dielectric substrate 2, for example, an alumina plate having a thickness Ts=0.2 mm. Such coplanar wiring lines may be formed through photolithography by etching a copper layer formed on the whole surface of the dielectric substrate 2. The wiring line 122 is a signal line and the wiring line 121 is a ground line.

A GaAs chip 1 formed with an electronic circuit and having a thickness Tc=250 $\mu$m is disposed over the dielectric substrate 2, with the surface on the electronic circuit side being directed downward, and fixed to the dielectric substrate 2 by pillars 3. For example, each pillar 3 has a cylindrical shape having a diameter of 40 $\mu$m and a height H of 9 $\mu$m. The pillar 3 may be formed on the surface of the GaAs chip 1 by plating or the like.

After the GaAs chip 1 is face-down-bonded, ultraviolet ray setting type resin 8 is coated over the whole surface of the GaAs chip 1 and cured upon application of ultraviolet rays.

FIG. 9B is a plan view showing the layout of wiring lines, pillars 3 and ultraviolet setting type resin 8 disposed on the dielectric substrate 2 and GaAs chip 1. On the GaAs chip 1, a signal line 112 and ground lines 111 are formed. The signal line 112 has a width of 20 $\mu$m in an electronic circuit area and is made wider at an end portion where a pillar having a diameter of 40 $\mu$m is connected. The ground wires 111 are spaced by 20 $\mu$m from the signal line 112 in the electronic circuit area and further spaced to about 60 $\mu$m at the end portions.

A space between the signal line 122 and ground lines 121 on the dielectric substrate 2 is 60 $\mu$m and is made wider to 86 $\mu$m near at the pillars. A distance between adjacent pillars is 110 $\mu$m.

In the foregoing trial of the above circuit layout, the signal line 112 on the GaAs chip 1 was connected to a pillar having a diameter of 20 $\mu$m without increasing its width at its end portion. In this case, the mechanical strength of the pillar was insufficient. From this reason, the diameter of the pillar was set to 40 μm to give a sufficient mechanical strength. From the above reason, the signal line 112 is widened at its end portion.

The signal line 122 on the alumina substrate has a width of 100 μm and is spaced apart from the ground lines 121 by 60 μm. The characteristic impedance of the signal line on the alumina substrate was about 50 Ω.

This characteristic impedance changed after sealing resin is coated on the signal line. In order to compensate for a change in the characteristic impedance, areas WG are formed and the signal line is spaced more from the ground lines in these areas. The space between the signal line and ground lines in these areas is 86 μm.

Ultraviolet setting type resin having a viscosity of one hundred thousand (Pa·sec) was used and the advance length measured from the outermost surface of a pillar was about 55 μm. The characteristic impedance of a pillar portion having the diameter of 40 μm is given by:

$$Z \approx (1/2)\{(\mu/\in eff)\}^{1/2} \cdot ln(d/a)$$

where $\mu$ is a magnetic permeability of the pillar, $\in eff$ is an effective dielectric constant, d is a distance between the centers of pillars, and a is a radius of the pillar.

The characteristic impedance of a pillar portion not covered with ultraviolet setting resin, i.e., in vacuum, is about 79 Ω from the above equation. The characteristic impedance of the pillar portion covered with ultraviolet setting type resin having a relative dielectric constant of 3.5 (effective dielectric constant is 2.5) is about 50 Ω. Thus, impedance matching can be achieved.

In the above description, a number of pillars having the same height are formed on a semiconductor substrate or a dielectric substrate. However, if a semiconductor substrate has steps in height on its surface, the height of each pillar is preferably changed in order to connect the stepped semiconductor substrate to a dielectric substrate having a flat surface. In the following, examples of forming pillars with different heights by the same process will be described.

Figure 10A:
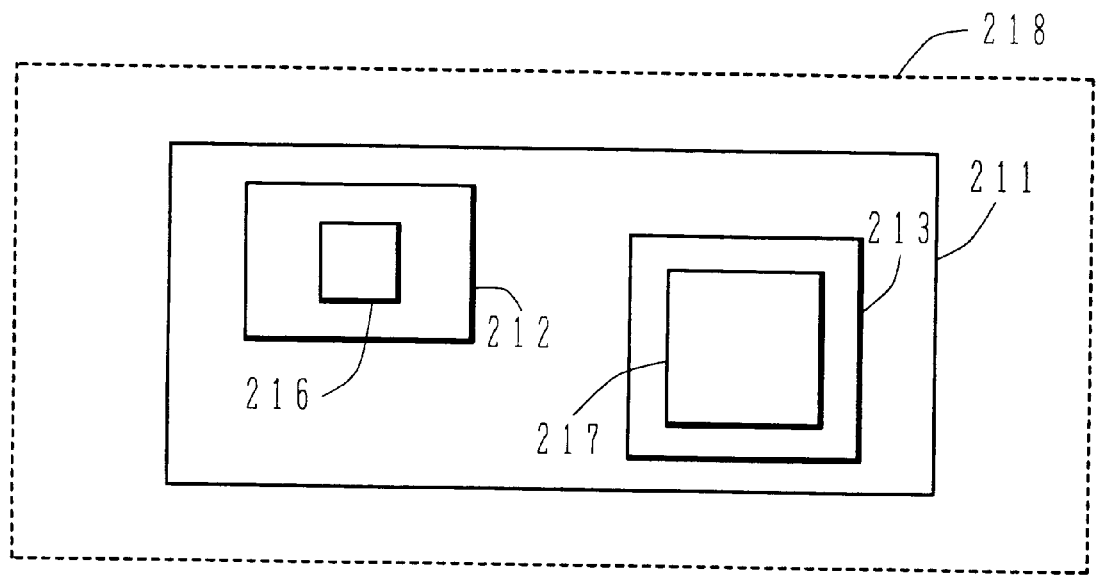
FIGS. 10A and 10B are a plan view and a cross sectional view showing a semiconductor device having a step in surface level.
Figure 10B:
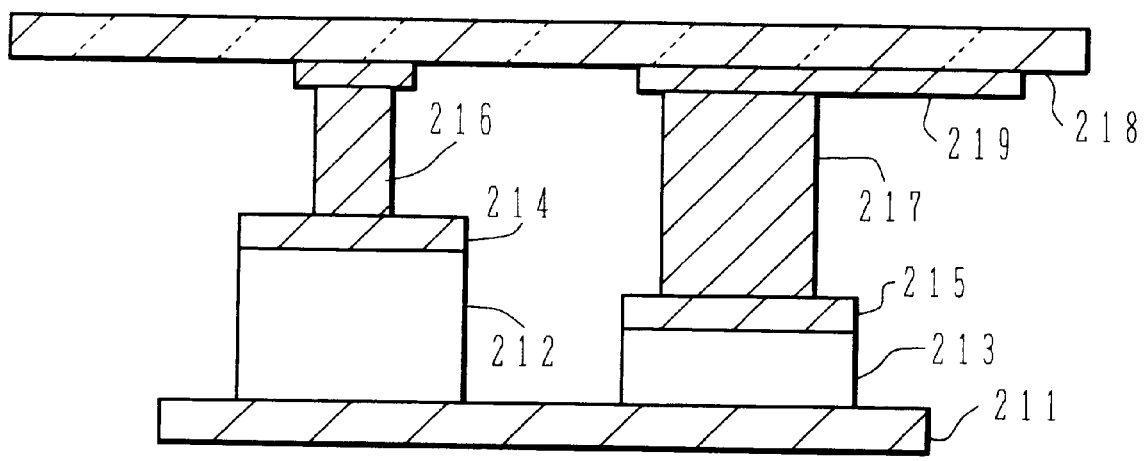

FIGS. 10A and 10B show an example of the structure of a semiconductor device. FIG. 10A is a plan view of a semiconductor substrate 211, and FIG. 10B is a vertical cross section of a flip-chip-bonded semiconductor device.

As shown in FIG. 10A, circuit elements 212 and 213 are formed on the surface of the semiconductor substrate 211.

As shown in FIG. 10B, these circuit elements 212 and 213 are different in height. Surface electrodes 214 and 215 are formed on the tops of the circuit elements 212 and 213.

In order to flip-chip-bond the semiconductor substrate 211 to an insulating substrate formed with wiring electrodes 219 by using pillars, it is necessary as shown in FIG. 10B to use conductive pillars 216 and 217 with different heights. By using the pillars 216 and 217 having different heights which cancel out the steps on the semiconductor substrate surface, the surface electrodes 214 and 215 on the semiconductor substrate 211 can be of equal height and be flip-chip-bonded to the wiring electrodes 219 on the insulating substrate 218.

The details of forming such pillars having different heights will be given hereinunder.

Figure 11A:
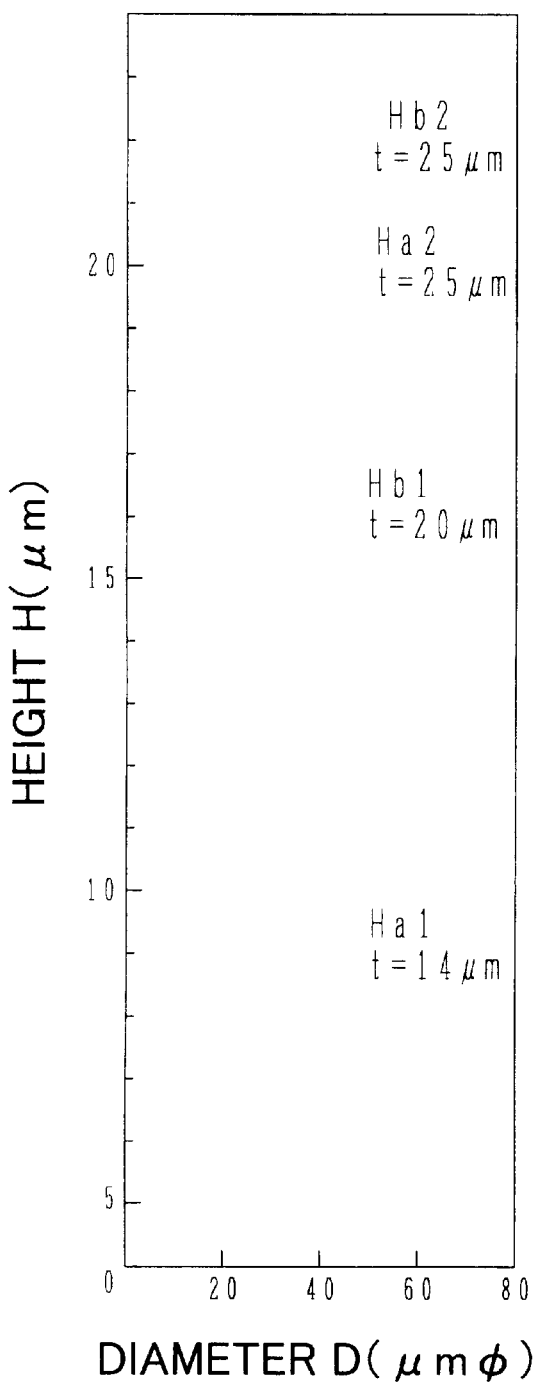
FIGS. 11A and 11B are a graph showing experiment results and a schematic cross sectional view showing the structure of a sample.

FIG. 11A is a graph showing a change in the height of a plated layer on an exposed bottom surface of an opening or hole of a resist mask deposited on an underlying layer. The abscissa represents a diameter D of an opening in the unit of μm and the ordinate represents a height H of a plated layer in the unit of μm.

Figure 11B:
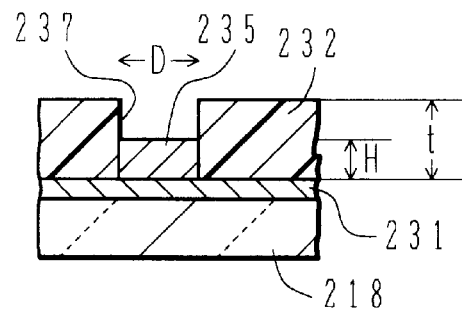

FIG. 11B is a schematic cross sectional view showing the structure of a sample used for measurements. A seed metal layer 231 is formed on the surface of an insulating substrate 218, and a photoresist layer 232 is formed on the surface of the seed metal layer 231. The photoresist layer 232 is formed by repeating a plurality of coating processes and has a thickness t. The photoresist layer 232 is subjected to contact or proximity exposure to form an opening 237. Samples having openings of different diameters D were prepared.

The seed metal layer 231 covered with the photoresist layer 232 having a hole or opening of the diameter D was plated to grow a plated layer 235. After the photoresist layer was removed, sintering was performed. The height H of the plated layer 235 was measured as a function of the opening diameter D.

As plating liquid, cyanogen containing plating liquids with different precipitation efficiencies were used.

In FIG. 11A, curves Ha1 and Ha2 indicate the measurement results using cyanogen containing plating liquid having a tradename AUTRONEX. Curves Hb1 and Hb2 indicate the measurement results using cyanogen containing plating liquid having a tradename TEMPEREX. The height of the plated layer can be controlled by changing the opening depth, i.e., photoresist layer thickness. The curves Ha1 and Ha2 indicate the characteristics obtained after the photoresist layer thicknesses were changed. The curves Hb1 and Hb2 were obtained in the similar manner. The thickness of each resist layer was Ha1=14 μm, Ha2=25 μm, Hb1=20 μm and Hb2=25 μm.

As seen from the curves shown in FIG. 11A, as the diameter D of an opening is increased, the height of a grown plated layer-increases greatly at the smaller diameter and thereafter gradually saturates. The range where the height H changes with the diameter D can be set relatively broadly by adjusting the thickness of each photoresist layer. Therefore, in order to form plated layers of different heights, the characteristic curve inclusive of a desired height is selected and then the diameter corresponding to the desired height is selected from the characteristic curve.

More specific examples will be described.

Figure 12A:
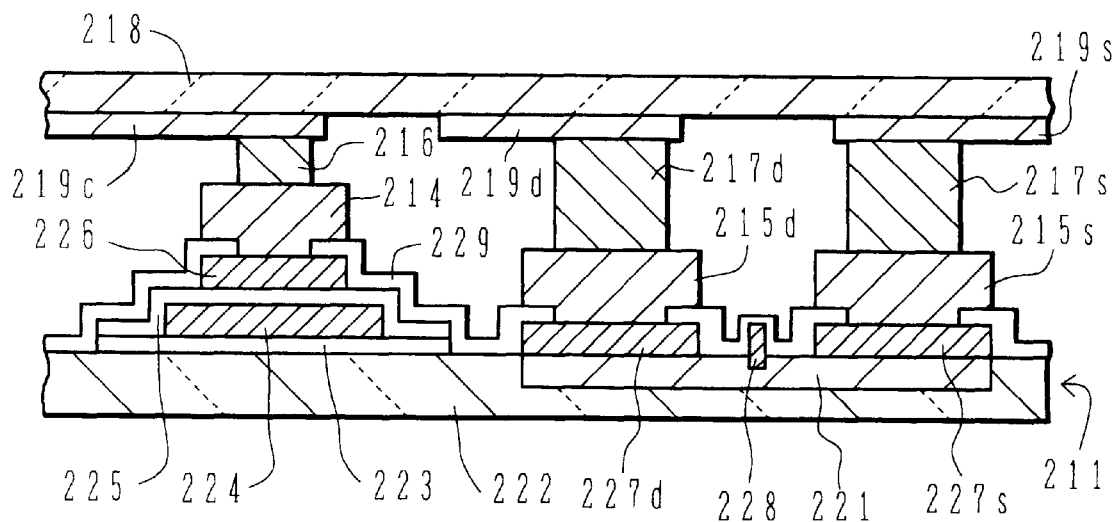
FIGS. 12A and 12B are a cross sectional view and a plan view showing a more specific example.

FIG. 12A is a cross sectional view of a flip-chip-bonded semiconductor device using compound semiconductor chips. A semiconductor substrate 211 is made of, for example, GaAs and has a channel region 221 in its surface layer. The peripheral area of the channel region is surrounded by a semi insulating region 222. A gate electrode 228, a source electrode 227s and a drain electrode 227d are formed over the channel region 221 to constitute a MESFET. The gate electrode 228 forms a Schottky contact with the channel region 221, and the source/drain electrodes 227s and 227d form an ohmic contact with the channel region. The source/drain electrodes 227s and 227d are made of, for example, a lamination of a 35 nm thick AuGe layer and a 154 nm thick Au layer.

On the semuinsulating region 222 at the left of MESFET, an SION layer 223 having a thickness of, for example, about 240 nm is formed, and on this SiON Layer 223 a capacitor lower electrode 224 is formed. The capacitor lower electrode 224 is made of, for example, a lamination of a 10 nm thick Ti layer and a 300 nm thick Au layer. An SiON layer 225 about 240 nm thick is formed on the capacitor lower electrode 224, and on this SiON layer 225 a capacitor upper electrode 226 is formed. Similar to the capacitor lower electrode 224, the capacitor upper electrode 226 is made of, for example, a lamination of a Ti layer about 10 nm thick and an Au layer about 300 nm thick. With this structure, there is a step of about 1 μm between the surface of the FET source/drain electrode 227 and the surface of the capacitor upper electrode 226.

A protective insulating film 229 is formed on the surface of the semiconductor substrate. The protective insulating layer 229 has openings which expose the central surface areas of the electrodes. On the exposed electrode surfaces, surface electrodes 214, 215s and 215d are formed.

Wiring electrodes 219c, 219s and 219d are formed on an insulating substrate 218. Conductive pillars 216, 217s and 217d having different heights are used to uniformly connect the surface electrodes 214, 215s and 215d to the wiring electrodes 219c, 219s and 219d. The conductive pillars may be formed either on the insulating substrate 218 or on the semiconductor substrate 211.

Figure 12B:
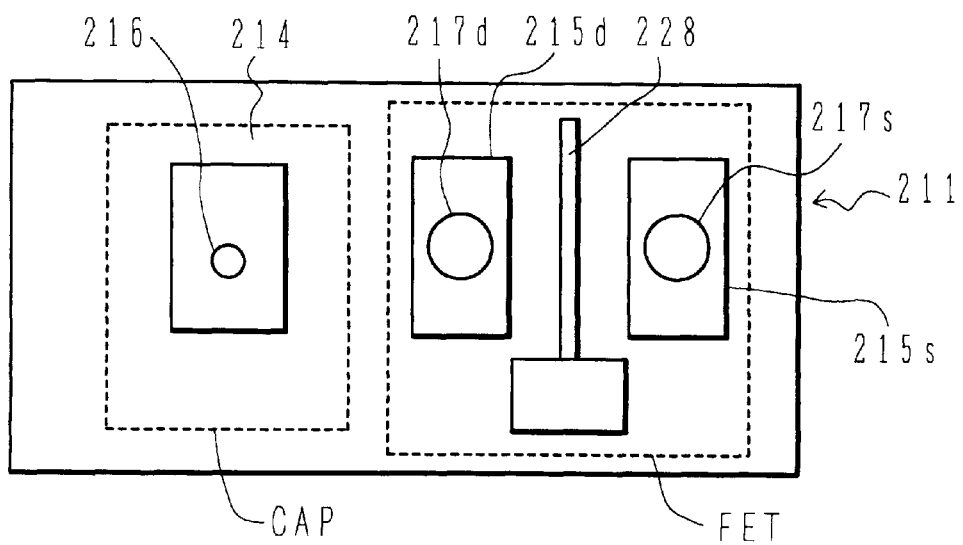

FIG. 12B is a schematic diagram showing the layout of the semiconductor substrate 211. The field effect transistor FET is formed in the right area in FIG. 12B, and the capacitor CAP is formed in the left area. A conductive pillar 216 having a smaller diameter is disposed on the capacitor surface electrode 214. Conductive pillars 217s and 217d having a larger diameter are disposed on the FET source/drain surface electrodes 215s and 215d. The gate electrode 228 is connected to the insulating substrate at a position not shown in the cross section of FIG. 12A.

The semiconductor substrate 211 with the transistor FET and capacitor CAP can be manufactured by well known processes. Next, a method of forming conductive pillars having different heights on an insulating substrate will be described.

Figure 13A:
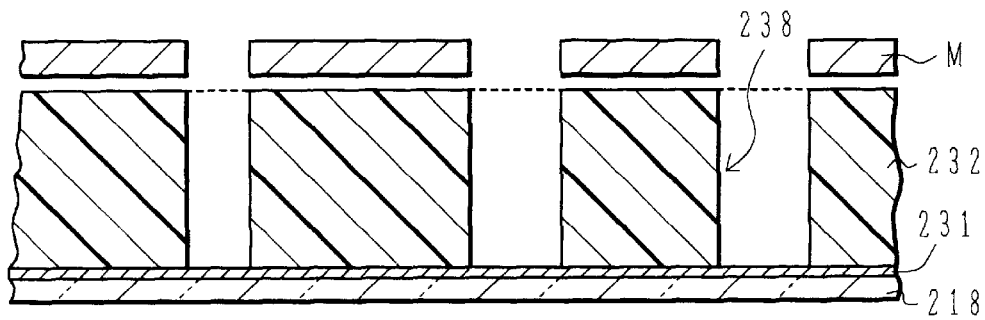
FIGS. 13A to 13D are cross sectional views illustrating a plating process.

FIG. 13A is a cross sectional view illustrating a process of forming a photoresist layer 232 with openings on an insulating substrate 218.

A seed metal layer 231 is formed on the insulating substrate 218 with wiring electrodes (not shown). For example. this seed metal layer 231 is made of an Au layer about 100 nm thick, or a lamination of a TiW layer about 100 nm thick and an Au layer about 100 nm thick. The seed metal layer 231 may be formed by sputtering, vapor deposition, plating or the like. On the surface of the seed metal layer 231, a photoresist layer 232 is formed by using resist material having a high viscosity. In using the curve Hb2 shown in FIG. 11A, the photoresist layer 232 was formed to a thickness of about 25 μm by coating resist material twice.

A mask M is placed on this photoresist layer to form openings through contact exposure or proximity exposure. The photoresist layer is developed to form openings 238. Instead of positive exposure described above, negative exposure may be used. In this case, the black and white of the mask is reversed.

In order to absorb a step of 1 μm between FET and CAP shown in FIG. 12A, a pillar of 19 μm high and pillars of 20 μm high are formed. It can be seen from the curve Hb2 shown in FIG. 11A that the diameters D of the openings are about 32.3 μm φ and about 34.6 μm φ in order to form plated layers of 19 μm and 20 μm high. The diameters of the openings 238 shown in FIG. 13A are designed in this manner.

Figure 13B:
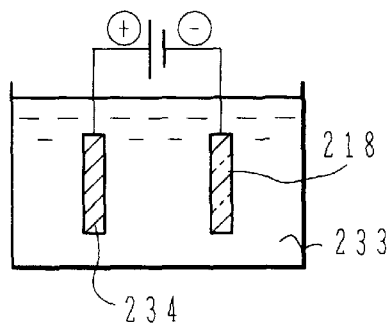

FIG. 13B illustrates a process of growing a plated layer on the seed metal layer 231 formed on the insulating substrate 218. The insulating substrate 218 formed with the photoresist layer 232 having openings of different diameters, together with an opposing electrode 234, is dipped in plating liquid 233. A positive potential is applied to the opposing electrode 234, and a negative potential is applied to the seed metal layer 231 of the insulating substrate to flow current of 5.8 A/Wf through the plating liquid 233 at a temperature of 43° C. The growth speed of the plated layer was about 0.15 μm/min.

Figure 13C:
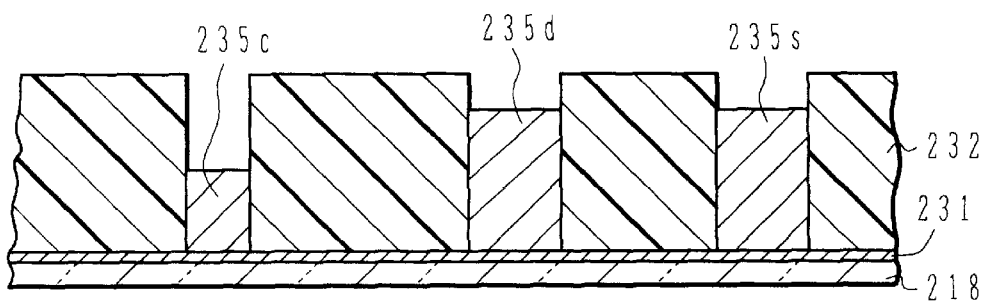

FIG. 13C is a schematic diagram showing the plated layers formed in the above manner. In the capacitor opening, a plated layer 235c about 19 μm high is grown, and in the openings for the FET source/drain electrodes, plated layers 235s and 235d about 20 μm high are grown. These plated layers each have a flat top surface.

Figure 13D:
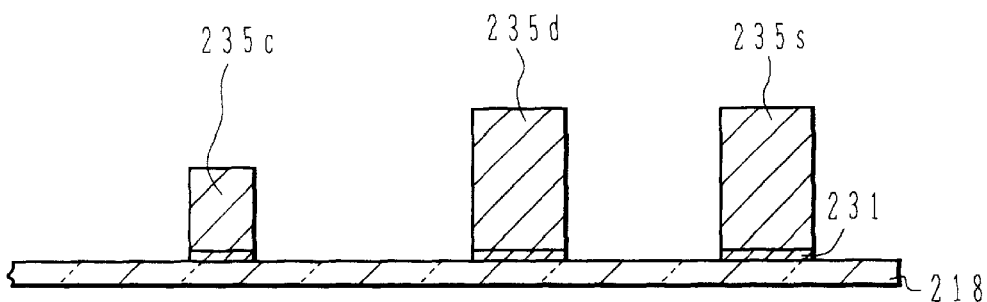

After the plated layers having desired heights are formed, the photoresist layer 232 is removed as shown in FIG. 13D. Thereafter, the seed metal layer 231 except those under the plated layer pillars is removed by ion milling. In this manner, pillar-shaped plated layers 235 each having a desired level can be formed on the insulating substrate 218.

The insulating substrate formed with the pillars having desired heights is placed on the semiconductor substrate 211 and bonded to the surface electrodes of the semiconductor substrate to thereby finish a flip-chip-bonded semiconductor device shown in FIG. 12A.

In this example, although the pillars are formed on the insulating substrate, they may be formed on the semiconductor substrate.

Figure 14:
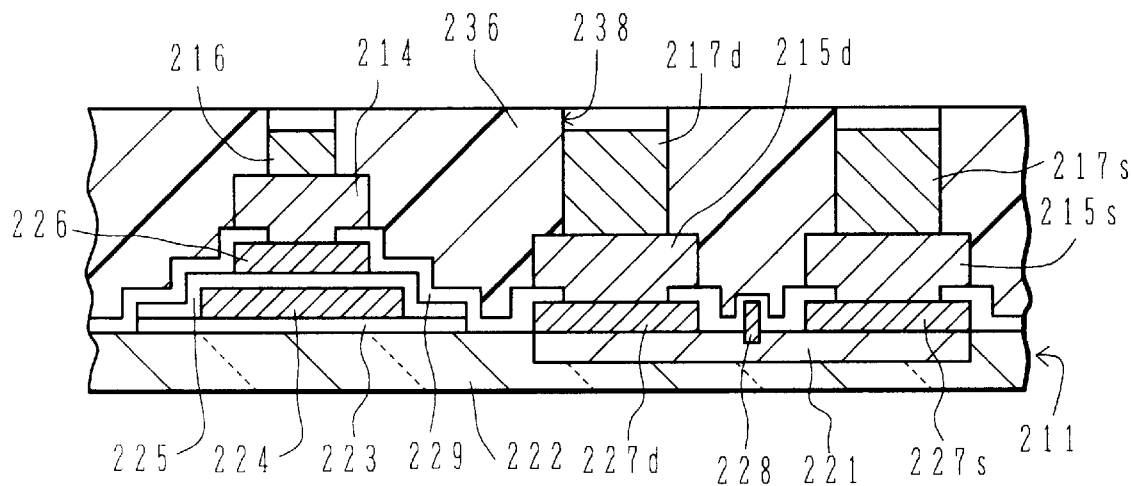
FIG. 14 is a cross sectional view illustrating another plating process.

FIG. 14 is a schematic diagram illustrating a process of forming conductive pillars on a semiconductor substrate 211. A photoresist layer 236 is coated on the surface of the semiconductor substrate 211. Similar to the previously described resist layer coating process, resist material is coated the desired number of times to form a sufficiently thick photoresist layer 236. A mask is disposed on the photoresist layer 236 to expose a desired pattern through contact or proximity exposure. By developing the photoresist layer 236, openings 238 are formed which expose surface electrodes 214, 215s and 215d.

Similar to the previous example, a plating process such as illustrated in FIG. 13B is performed to form pillars 216, 217s and 217d on the surface electrodes 214, 215s and 215d. Thereafter, the photoresist layer 236 is removed.

Figure 15:
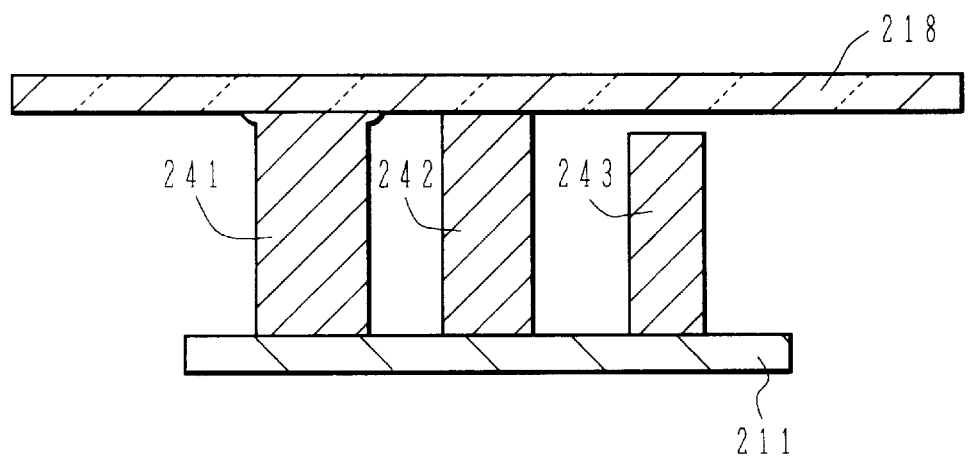
FIG. 15 is a cross sectional view illustrating the function of monitor pillars as another example of the structure of a semiconductor device.

FIG. 15 is a schematic diagram showing another example of a semiconductor device. An insulating substrate 218 is bonded to a semiconductor substrate 211. Pillars 241, 242 and 243 are formed on a peripheral surface area of the semiconductor substrate 211, the pillars 241, 242 and 243 gradually reducing their heights. These pillars are used as monitor pillars, whereas conductive pillars used for electrical connection are formed on the surface of a circuit portion in another area of the semiconductor substrate 211.

Consider for example that the monitor pillar 242 has a height substantially equal to that of the pillar used for the electrical connection in the circuit portion. In this case, the highest pillar 241 is depressed, and the next highest pillar 242 is in a good bonding state to the insulating substrate 218. If the insulating substrate 218 is applied with too high a pressure, the lowest pillar 243 is also bought in contact with the insulating substrate 218.

A good bonding state can be judged from the state that two of the three pillars of different heights contact the insulating substrate 218. If only one pillar is in contact with the insulating substrate, it means an insufficient pressure applied to the insulating substrate, whereas if all the three pillars become in contact with the insulating substrate, it means an excessive pressure.

After the flip-chip-bonding during semiconductor manufacture processes, the condition of the bonding state can be judged easily by looking at the bonding state of the monitor pillars 241, 242 and 243. Namely, without flowing current, the condition of bonding can be judged easily.

A semiconductor substrate having a transistor and a capacitor has been used only illustratively, and semiconductor substrates of any structure may be used. A semiconductor substrate is not limited to only a compound semiconductor substrate, but an Si substrate may also be used with similar advantages of face-down-bonding such as flip-chip-bonding.

In the above description, a semiconductor substrate having a step on the surface thereof is face-down-bonded to an insulating substrate formed with wiring electrodes on the surface thereof. Similar processes may be used for face-down-bonding between a substrate having a flat surface and a substrate having a stepped surface. For example, a compound semiconductor substrate may be flip-chip-bonded to an Si substrate.

A substrate with a resist mask is dipped in plating liquid for performing electroplating. Instead, electroless plating may be used. Other plating methods such as a pad method may be used.

The present invention has been described in connection with the preferred embodiments. The invention is not limited only to the above embodiments. It will be apparent to those skilled in the art that various modifications, improvements, combinations, and the like can be made.

What is claimed is:

1. A face-down-bonded semiconductor device comprising:
   a semiconductor substrate having a semiconductor electric/electronic circuit formed on the surface of said semiconductor substrate, the circuit having contact terminals;
   wiring pillars made of conductive material and disposed on the contact terminals on the surface of said semiconductor substrate; and
   support pillars disposed at positions different from the contact terminals on the surface of said semiconductor substrate, said support pillars each having a top surface generally at the same height as the height of each of said wiring pillars, said wiring pillars and said support pillars being disposed at spaced locations to define a plurality of closed loops surrounding a central area of said semiconductor substrate.

2. A semiconductor device according to claim 1, further comprising a metal layer alloyed with said semiconductor substrate, said metal layer being formed in an area where said semiconductor substrate contacts at least one of said wiring pillars or said support pillars.

3. A semiconductor device according to claim 1, wherein said wiring pillars are disposed along an inner loop of the plurality of loops.

4. A semiconductor device comprising:
   a semiconductor substrate having a semiconductor electric/electronic circuit formed on the surface of said semiconductor substrate, the circuit having contact terminals;
   wiring pillars made of conductive material and disposed on the contact terminals on the surface of said semiconductor substrate;
   support pillars disposed at positions different from the contact terminals on the surface of said semiconductor substrate, said support pillars each having a top surface generally at the same height as the height of each of said wiring pillars; and
   at least some of said wiring pillars or said support pillars having a diameter at a middle portion in a vertical direction larger than a diameter of the other portions.

5. A face-down-bonded semiconductor device comprising:
   a first substrate having an insulating surface on which wiring lines are formed;
   a second substrate having a semiconductor surface and formed with a semiconductor electric/electronic circuit having contact terminals on a surface facing the wiring lines:
   a plurality of pillars disposed in an array extending around a space between said first and second substrates, said plurality of pillars including wiring pillars operative to connect the wiring lines to the contact terminals and support pillars operative to connect said first and second substrates; and
   a reinforcing material member covering the surface of said second substrate on the opposite side to the semiconductor surface and extending to said first substrate, said reinforcing material member being in contact with at least some of said pillars and at least some of the space between said first and second substrates being devoid of reinforcing material.

6. A face-down-bonded semiconductor device according to claim 5, further comprising an alloyed metal layer in an area where at least one of said plurality of pillars is connected to one of said first and second substrates.

7. A face-down-bonded semiconductor device according to claim 6, wherein the metal layer is alloyed with said one of said first and second substrates in an area where at least one of said plurality of pillars is connected to one of said first and second substrates.

8. A face-down-bonded semiconductor device according to claim 5, wherein the layout of said plurality of pillars forming said array and the characteristics of said plurality of pillars and said reinforcing material member are selected so that said reinforcing material member is held back from penetrating said space by said plurality of pillars.

9. A face-down-bonded semiconductor device according to claim 5, wherein the space is hermetically sealed from external air by said first and second substrates and said reinforcing material member.

10. A face-down-bonded semiconductor device according to claim 5, wherein said semiconductor electric/electronic circuit is not in contact with said reinforcing material member.

11. A face-down-bonded semiconductor device according to claim 10, wherein said plurality of pillars are disposed along a plurality of loops surrounding the semiconductor electric/electronic circuit.

12. A face-down-bonded semiconductor device according to claim 11, wherein the wiring pillars are disposed along an inner loop among the plurality of loops.

13. A face-down-bonded semiconductor device according to claim 11, wherein at least some of the wiring pillars or the support pillars have a diameter at a middle portion in a vertical direction larger than a diameter of the other portions.

14. A face-down-bonded semiconductor device according to claim 1 wherein the support pillars are electrically disconnected from the electric/electronic circuit.

* * * * *